US009397657B1

(12) United States Patent
Zhao et al.

(10) Patent No.: US 9,397,657 B1
(45) Date of Patent: Jul. 19, 2016

(54) METHODS AND SYSTEMS FOR OPERATING HYBRID POWER DEVICES USING MULTIPLE CURRENT-DEPENDENT SWITCHING PATTERNS

(71) Applicant: Eaton Corporation, Cleveland, OH (US)

(72) Inventors: Tiefu Zhao, Fox Point, WI (US); Jiangbiao He, Milwaukee, WI (US); Vijay Bhavaraju, Germantown, WI (US); Mengbin Ben Yang, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 14/577,154

(22) Filed: Dec. 19, 2014

Related U.S. Application Data

(60) Provisional application No. 62/028,349, filed on Jul. 24, 2014, provisional application No. 62/028,354, filed on Jul. 24, 2014.

(51) Int. Cl.
*H03K 17/687* (2006.01)
*H03K 17/60* (2006.01)
*H03K 17/567* (2006.01)

(52) U.S. Cl.
CPC .................... *H03K 17/567* (2013.01)

(58) Field of Classification Search
CPC .......... H03K 17/567; H03K 17/04123; H03K 17/6877; H03K 17/063; H03K 17/6874
USPC ............................ 327/427, 432, 434, 436, 403
See application file for complete search history.

(56) References Cited

U.S. PATENT DOCUMENTS 4,366,522 A 12/1982 Baker
5,291,082 A 3/1994 Revillet et al.
(Continued)

FOREIGN PATENT DOCUMENTS

DE 102008010467 A1 9/2009
EP 0 620 645 A2 10/1994
(Continued)

OTHER PUBLICATIONS

Notification of Transmittal of the International Search Report and the Written Opinion of the International Searching Authority, or the Declaration, in corresponding PCT Application No. PCT/US2015/041912 mailed Oct. 2, 2015 (13 pages).
(Continued)

*Primary Examiner* — Lincoln Donovan
*Assistant Examiner* — Diana J Cheng
(74) *Attorney, Agent, or Firm* — Myers Bigel & Sibley, P.A.

(57) ABSTRACT

An integrated circuit includes a hybrid switch having first and second switching devices of different type therein. A control circuit is provided, which is configured to drive the first and second devices with respective first and second control signals having first and second unequal duty cycles, respectively, when the first and second devices are supporting a forward current in a first current range. The control circuit is further configured to drive the first and second devices with respective third and fourth control signals having third and fourth unequal duty cycles, respectively, when the first and second devices are supporting a forward current in a second current range outside the first current range. The first duty cycle may be greater than the second duty cycle and the third duty cycle may be less than the fourth duty cycle.

16 Claims, 15 Drawing Sheets

(56) References Cited

U.S. PATENT DOCUMENTS

| | | | |
|---|---|---|---|
| 5,610,507 A | | 3/1997 | Brittan |
| 5,959,464 A | | 9/1999 | Qualich |
| 5,999,525 A | * | 12/1999 | Krishnaswamy ... H04L 12/1818 370/352 |
| 7,034,345 B2 | | 4/2006 | Chang et al. |
| 7,049,658 B2 | | 5/2006 | Saito et al. |
| 7,230,273 B2 | | 6/2007 | Kitabatake et al. |
| 7,294,886 B2 | | 11/2007 | Saito et al. |
| 7,436,004 B2 | | 10/2008 | Shimoida et al. |
| 7,521,731 B2 | | 4/2009 | Shimoida et al. |
| 7,556,994 B2 | | 7/2009 | Sankin et al. |
| 7,671,409 B2 | | 3/2010 | Kitabatake et al. |
| 7,820,511 B2 | | 10/2010 | Sankin et al. |
| 8,017,978 B2 | | 9/2011 | Lidow et al. |
| 8,076,698 B2 | | 12/2011 | Ueda et al. |
| 8,994,442 B2 | * | 3/2015 | Konstantinov ....... H03K 17/164 327/433 |
| 2004/0252430 A1 | | 12/2004 | Oumaru et al. |
| 2005/0280401 A1 | | 12/2005 | Plankensteiner |
| 2010/0090728 A1 | | 4/2010 | Logiudice et al. |
| 2010/0301929 A1 | | 12/2010 | Zhang et al. |
| 2011/0013438 A1 | | 1/2011 | Frisch et al. |
| 2011/0310645 A1 | | 12/2011 | Godo |
| 2012/0057387 A1 | * | 3/2012 | Lai ........................ H02M 7/797 363/132 |
| 2012/0274388 A1 | | 11/2012 | Badger et al. |
| 2012/0280728 A1 | | 11/2012 | Hussein et al. |
| 2012/0307540 A1 | * | 12/2012 | Tagome ................ H02M 1/088 363/131 |
| 2013/0062626 A1 | * | 3/2013 | Takao .................. H03K 17/127 257/77 |
| 2013/0257177 A1 | | 10/2013 | Jacobson et al. |
| 2014/0185346 A1 | | 7/2014 | Liu et al. |

FOREIGN PATENT DOCUMENTS

| | | |
|---|---|---|
| FR | 2 680 925 A1 | 3/1993 |
| JP | 2003-339122 A | 11/2003 |
| WO | WO 98/10301 A1 | 3/1998 |
| WO | WO 2014/105888 A1 | 7/2014 |

OTHER PUBLICATIONS

Burm et al.; Wide Band-gap FETs for High Power Amplifiers; Journal of Semiconductor Technology and Science, vol. 6, No. 3, Sep. 2006; Dept. of Electronic Engineering, Sogang University, Seoul 121-742, Korea; pp. 175-182.

Domes et al., "1$^{st}$ industrial 1200V SiC JFET module for high energy efficiency applications"; Editorial PCIM Europe 2011—Infineon Technologies AG, Warstein; Germany; 11 pages.

Infineon; Technical Information—IGBT—Module FF45R12W1J1_B11; (Draft); 7 pages.

Ozpineci et al.; "Comparison of Wide-Bandgap Semiconductors for Power Electronics Applications"; Oak Ridge National Laboratory, Oak Ridge, Tennessee 37831; ORNL/TM-2003/257; Dec. 12, 2003; 34 pages.

Powerex®—Application NOTES: Introduction to Three Level Inverter (TLI) Technology; First Release: Jun. 1, 2009; 3 pages.

Reed et al.; "Modeling Power Semiconductor Losses in HEV Powertrains using Si and SiC Devices"; Department of Electrical and Computer Engineering; University of Wisconsin—Madison, Madison, WI 53706, USA and INRETS, Transport and Environment Laboratory 25 Ave. Francois Mitterand—69675 Bron Cedex, France; Sep. 1-3, 2010; 6 pages.

International Search Report Corresponding to International Application No. PCT/US2013/077669; Date of Mailing: Dec. 24, 2013; 6 Pages.

* cited by examiner

METHODS AND SYSTEMS FOR OPERATING HYBRID POWER DEVICES USING MULTIPLE CURRENT-DEPENDENT SWITCHING PATTERNS

CROSS-REFERENCE TO RELATED APPLICATION

The present application is related to U.S. application Ser. No. 14/577,340, filed Dec. 19, 2014, entitled "Methods and Systems for Operating Hybrid Power Devices Using Driver Circuits That Perform Indirect Instantaneous Load Current Sensing", the disclosure of which is hereby incorporated herein by reference.

FIELD OF THE INVENTION

The present invention relates to integrated circuit devices and, more particularly, to integrated circuit devices for power switching applications and methods of operating same.

BACKGROUND OF THE INVENTION

Wide bandgap (WBG) power devices such as SiC and GaN power devices can provide superior performance characteristics relative to Si power devices for many high power applications. For example, as disclosed in an article by J. Burm et al., entitled "Wide Band-Gap FETs for High Power Amplifiers," Journal of Semiconductor Technology and Science, Vol. 6, No. 3, pp. 175-182, September (2006), wide bandgap semiconductor materials having band-gap energy levels in a range from about 2 eV to about 6 eV may be utilized to provide high breakdown voltages for high power generation in power amplifiers and low dielectric constants for better isolation and lower coupling. Similarly, as disclosed in an article by J. Reed et al., entitled "Modeling Power Semiconductor Losses in HEV Powertrains using Si and SiC Devices," Vehicle Power and Propulsion Conference (VPPC), 2010 IEEE, Sep. 1-3 (2010), silicon carbide (SiC) power devices can have potential benefits over conventional silicon-based devices, particularly in high power electronic converters.

Examples of high power switches that embody wide bandgap semiconductors are disclosed in U.S. Pat. Nos. 7,556,994 and 7,820,511 to Sankin et al., which illustrate normally-off vertical JFET integrated power switches, U.S. Pat. No. 7,230,273 to Kitabatake et al., which describes a plurality of wide bandgap switching elements connected in parallel to increase device yield, and U.S. Pat. No. 8,017,978 to Lidow et al., which illustrates multiple power devices of different type connected in series. These SiC and other wide bandgap power devices can provide greater power converter efficiency and power density by operating at higher switching frequencies and temperatures. However, all-SiC high-power converters with exclusively SiC devices will significantly increase the semiconductor device cost, especially if the power converters need to meet any overload requirements and the semiconductor devices are sized according to overload requirements. For example, in Uninterruptable Power Supply (UPS) applications, typically the overload performances are 150% overload for 10 s to 60 s and 200% overload for 10 to 20 cycles (with the current limit).

To address this excessive cost issue and meet overload requirements, higher and lower cost devices may be paralleled together as a hybrid device, which may be capable of more fully utilizing each of the individual devices positive characteristics so that a higher power rating may be achieved at lower overall cost. Examples of such hybrid devices are disclosed in articles by Jih-Sheng Lai et al., entitled "A Hybrid-Switch-Based Soft-Switching Inverter for Ultrahigh-Efficiency Traction Motor Drives," IEEE Transactions on Industry Applications, Vol. 50, No. 3, May/June (2014); and Pengwei Sun, et al., entitled "A 55-kW Three-Phase Inverter Based on Hybrid-Switch Soft-Switching Modules for High-Temperature Hybrid Electric Vehicle Drive Application," IEEE Transactions on Industry Applications, Vol. 48, No. 3, May/June (2012). Still further hybrid power devices are disclosed in commonly assigned U.S. Publ. App. No. 2014/0185346, entitled "Hybrid Power Devices and Switching Circuits for High Power Load Sourcing Applications," the disclosure of which is hereby incorporated herein by reference. Notwithstanding these devices, there continues to be a need for more efficient methods of operating hybrid power devices for higher performance and efficiency and lower overall cost.

SUMMARY OF THE INVENTION

An integrated circuit according to some embodiments of the invention includes a hybrid switch having first and second switching devices of different type therein. These first and second switching devices are electrically coupled together to support parallel currents therein in response to respective control signals received at respective first and second control terminals (e.g., gate terminals) of the first and second switching devices. In some embodiments of the invention, the first and second switching devices may include wide bandgap semiconductor switching devices in combination with silicon switching devices. Typical wide bandgap semiconductor switching devices include SiC MOSFETs and JFETs and typical silicon switching devices include Si-IGBTs, however, other combinations of switching devices are also possible.

These embodiments of the invention may also include a control circuit, which is configured to drive the first and second control terminals with respective first and second periodic control signals having first and second unequal duty cycles, respectively, when the first and second switching devices are disposed to collectively support a forward current in a first current range. In addition, the control circuit is further configured to drive the first and second control terminals with respective third and fourth periodic control signals having third and fourth unequal duty cycles, respectively, when the first and second switching devices are disposed to collectively support a forward current in a second current range outside the first current range. According to these embodiments of the invention, the first duty cycle is greater than the second duty cycle and the third duty cycle is less than the fourth duty cycle.

According to further embodiments of the invention, the control circuit may generate the periodic control signals so that active phases of the second periodic control signal occur exclusively within active phases of the first periodic control signal. In addition, the active phases of the third periodic control signal may be controlled to occur exclusively within active phases of the fourth periodic control signal. According to additional embodiments of the invention, the active phases of the first and second periodic control signals may be controlled so that the active-to-inactive transitions of the second periodic control signal precede corresponding active-to-inactive transitions of the first periodic control signal. In some additional embodiments of the invention, the inactive-to-active transitions of the first periodic control signal may be controlled to precede corresponding inactive-to-active transitions of the second periodic control signal. Furthermore, the inactive-to-active transitions of the fourth periodic control signal may be controlled to precede corresponding inactive-to-active transitions of the third periodic control signal. And, active-to-inactive transitions of the third periodic control signal may be controlled to precede corresponding active-to-inactive transitions of the fourth periodic control signal.

According to additional embodiments of the invention, the second switching device is an insulated-gate bipolar transistor (e.g., Si-IGBT) and the first switching device is a three or more terminal switching device selected from a group consisting of junction field effect transistors (JFETs), insulated-gate field effect transistors (IGFETs, MOSFETs), integrated gate-commutated thyristors (IGCT) and high electron mobility transistors (HEMTs). Moreover, the first switching device may be formed of a wide bandgap semiconductor material selected from a group consisting of silicon carbide (SiC), gallium nitride (GaN) and diamond, for example.

According to still further embodiments of the invention, the control circuit may operate to hold the first control terminal at an inactive voltage level while the second switching device is repeatedly switched on-and-off to support a forward current in a third current range intermediate the first and second current ranges. This switching of the second switching device may be in response to a fifth periodic control signal generated by the control circuit. In addition, the control circuit may be configured to hold the second control terminal at an inactive voltage level while the first switching device is repeatedly switched on-and-off to support a forward current in a current range below the first current range. This switching of the first switching device may be in response to a sixth periodic control signal generated by the control circuit.

Thus, according to some embodiments of the invention, based on the above-described control circuit operations, a hybrid switching device containing a SiC MOSFET/JFET and a plurality of Si-IGBTs may be switched through a monotonically increasing load current using the following switching patterns, in sequence: (i) SiC only; (ii) SiC first turn-on, SiC last turn-off, with IGBT conduction support; (iii) IGBT only (optional); and (iv) IGBT first turn-on, IGBT last turn-off, with SiC conduction support.

Integrated circuits according to still further embodiments of the invention can include a hybrid switch having at least first and second switching devices of different type therein. These switching devices, which are electrically coupled together to support parallel currents within the hybrid switch, are responsive to first and second control signals received at respective first and second control terminals of the first and second switching devices. A control circuit is provided, which is configured to drive the first and second control terminals with respective first and second periodic control signals having first and second unequal duty cycles, respectively, when the hybrid switch is supporting a forward current at a first current level. The control circuit is further configured to drive the first and second control terminals with respective third and fourth periodic control signals having third and fourth unequal duty cycles, respectively, when the hybrid switch is supporting a forward current at a second current level greater than the first current level. According to these embodiments of the invention, the first and fourth duty cycles are greater than the second and third duty cycles, respectively. According to still further embodiments of the invention, the control circuit may operate to hold the first control terminal at an inactive voltage level when the second switching device is disposed to support a forward current at a third current level intermediate the first and second current levels. According to further aspects of these embodiments of the invention, the control circuit may include a reduced instruction set computing (RISC) controller and a look-up table containing I-V data relating to the first and second switching devices, therein.

Still further embodiments of the invention include integrated circuits having current-sensing device driver circuits therein. A driver circuit according to these embodiments of the invention may be configured to drive first and second control terminals of respective first and second parallel switching devices of different type within a hybrid switch with respective first and second periodic control signals. These control signals, which preferably establish a first on-off switching pattern within the hybrid switch, are generated in response to the driver circuit estimating a forward on-state current in the hybrid switch from a measurement of a first voltage associated with at least a first terminal of the hybrid switch. In particular, the driver circuit may be configured to estimate the forward on-state current in the hybrid switch from the first voltage (e.g., $V_{CE}$, $V_{DS}$), a first active level voltage associated with the first periodic control signal (e.g., $V_{GS}$ or $V_{GE}$) and a second active level voltage associated with the second periodic control signal (e.g., $V_{GE}$ or $V_{GS}$). These estimation operations may be performed by a processor having a reduced instruction set computing (RISC) architecture.

According to additional embodiments of the invention, the current-sensing device driver circuit includes a processor, which is programmed to compute the estimate of the forward on-state current in the hybrid switch from at least stored device I-V output characteristics associated with the hybrid switch, the first voltage, the first and second active level voltages and possibly a measurement or estimate of a temperature associated with the hybrid switch. At least some of the I-V output characteristics may be stored in a look-up table within the processor.

According to further aspects of these embodiments of the invention, the current-sensing device driver circuit may perform the additional operations of driving the first and second control terminals with respective third and fourth periodic control signals that establish a second on-off switching pattern within the hybrid switch that is unequal to the first on-off switching pattern. Moreover, these additional operations may be performed in response to estimating an updated forward on-state current in the hybrid switch from an updated first voltage associated with the first terminal while the hybrid switch is being driven with the first and second periodic control signals.

According to additional embodiments of the invention, an integrated circuit is provided with a current-estimating device driver circuit. This driver circuit may be configured to drive at least first and second control terminals (e.g., gate terminals) of respective first and second parallel switching devices of different type within a hybrid switch with respective first and second periodic control signals that establish a second on-off switching pattern within the hybrid switch. These driving operations may be performed in response to measuring a first voltage associated with at least a first terminal of the hybrid switch when the hybrid switch is being driven by periodic control signals that establish a first on-off switching pattern within the hybrid switch, which is different than the second on-off switching pattern. In these embodiments of the invention, the driver circuit may include a "local" processor configured to estimate a forward on-state current in the hybrid switch from at least stored I-V data associated with the hybrid switch and the first voltage. At least some of the I-V data associated with the hybrid switch may be stored in a look-up table within the processor. In addition, the first voltage may be measured using a fast recovery diode (FRD) having a cathode terminal electrically coupled to the first terminal of the hybrid switch.

According to further embodiments of the invention, an integrated circuit is provided with a system microcontroller (e.g., MCU), which is configured to generate at least a first pulse-width modulated (PWM) control signal that is free of switching pattern information embedded therein. A current-estimating gate driver module is also provided, which is responsive to the first PWM control signal. This gate driver module is configured to drive at least first and second gate terminals of respective first and second parallel switching devices within a hybrid switch with unequal gate signals that establish a second switching pattern within the hybrid switch. These gate driving operations are performed in response to measuring a first voltage associated with at least a first terminal of the hybrid switch when being driven by unequal gate signals that establish a first switching pattern within the hybrid switch that is different from the second switching pattern. As described hereinabove, the duty cycles of the gate signals associated with the second switching pattern are unequal and the duty cycles of the gate signals associated with the first switching pattern are unequal.

DETAILED DESCRIPTION OF EMBODIMENTS

Figure 1A:
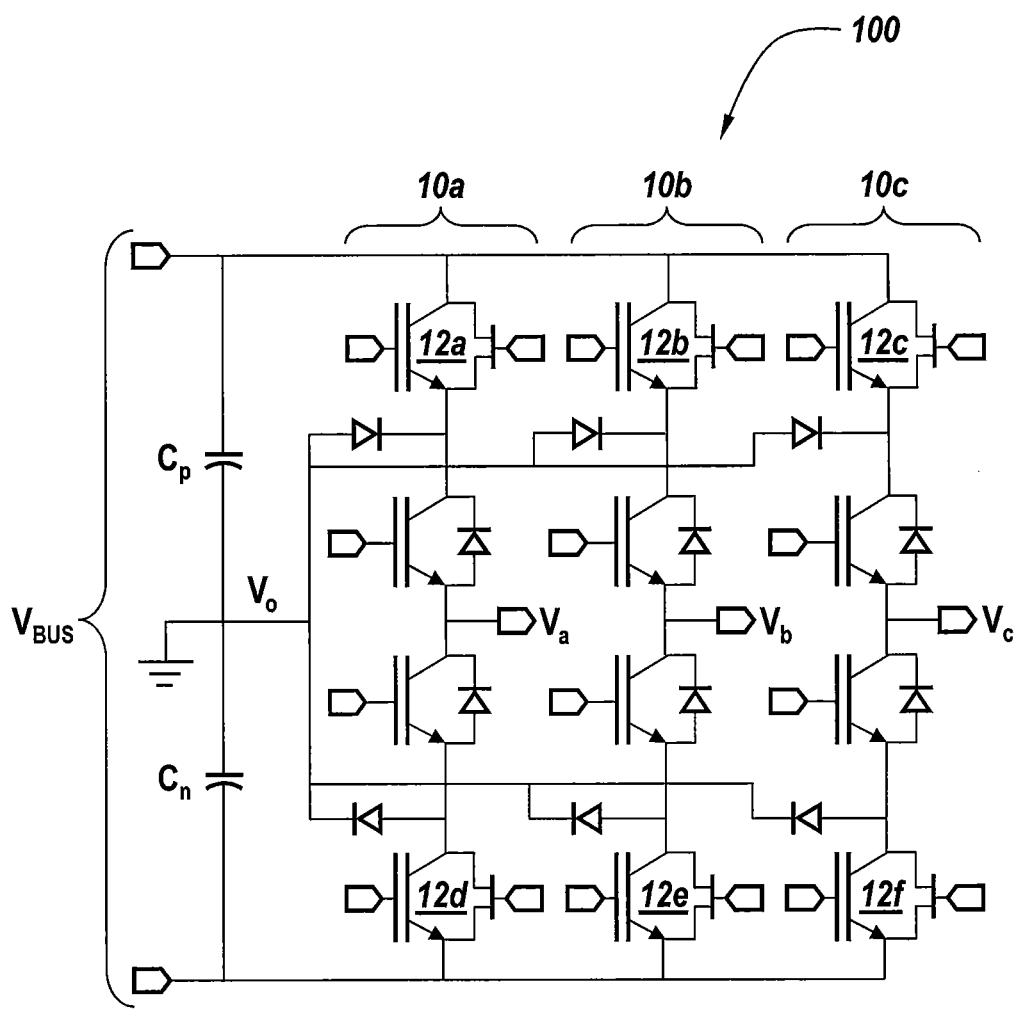
FIG. 1A is an electrical schematic of a neutral-point clamped (NPC) inverter according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
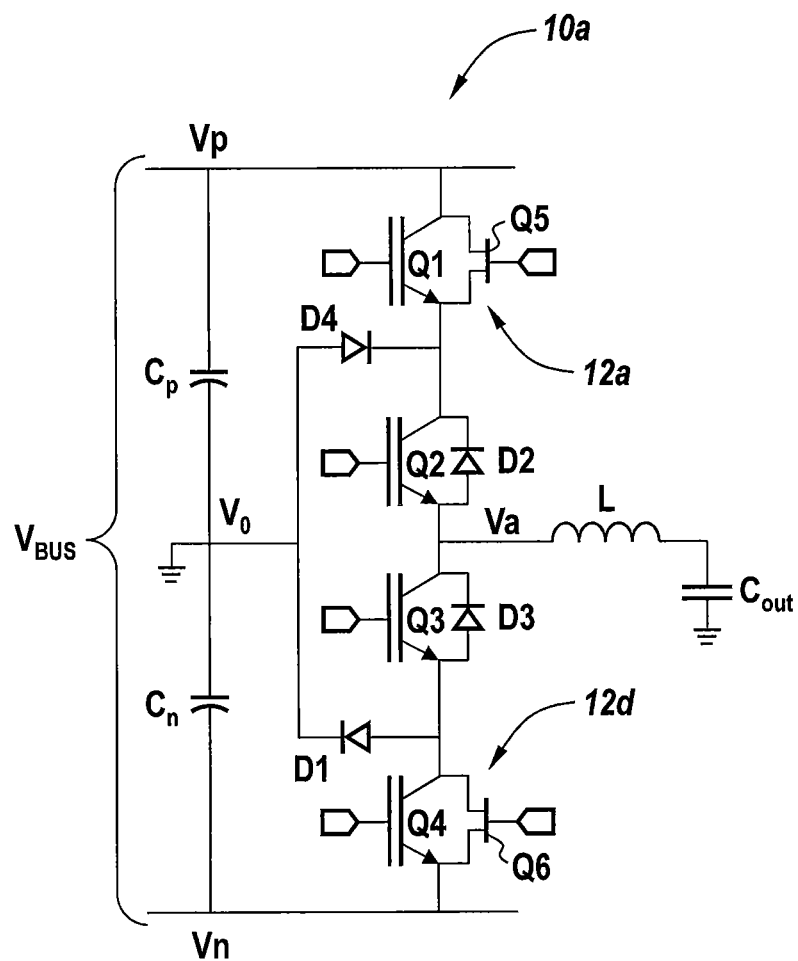
FIG. 1B is an electrical schematic of a single inverter "leg" taken from the NPC inverter of FIG. 1A.

Referring now to FIGS. 1A-1B, a conventional three level inverter 100, also referred to as a neutral-point clamped (NPC) inverter, is illustrated as including a pair of series-connected bus capacitors Cp and Cn and three equivalent inverter legs 10a, 10b and 10c, which are configured to convert a DC input voltage provided on an input bus ($V_{BUS}$) into three periodic leg output voltages Va, Vb and Vc. As illustrated by FIG. 1A, each inverter leg 10a, 10b and 10c includes four IGBTs connected in series in a totem pole arrangement across the input bus. The first leg 10a includes a pair of hybrid switches 12a, 12d, the second leg 10b includes a pair of hybrid switches 12b, 12e, and the third leg 10c includes a pair of hybrid switches 12c and 12f, connected as "outer" devices as illustrated. Each of the legs 10a, 10b and 10c also includes respective pairs of "inner" switching devices, which are formed as parallel combinations of IGBTs and free-wheeling diodes. To reduce conducting losses during light loads, the pair of inner switching devices may be configured as equivalent to the "outer" hybrid switches, by replacing the free-wheeling diodes with wide bandgap transistors.

Referring now to FIG. 1B, the inverter leg 10a of FIG. 1A is illustrated as including a first silicon IGBT Q1 and transistor Q5, which is configured as a wide bandgap JFET (e.g., GaN JFET). These transistors are connected in parallel as an uppermost hybrid switch 12a in the first inverter leg 10a. Similarly, a fourth silicon IGBT Q4 and transistor Q6, which is configured as a wide bandgap JFET, are connected in parallel as a lowermost hybrid switch 12d in the first inverter leg 10a. A second silicon IGBT Q2 and free-wheeling diode D2 are connected in parallel along with a third IGBT Q3 and free-wheeling diode D3. Clamp diodes D1 and D4 provide an electrical connection to a neutral point $V_0$ between the bus capacitors. As shown in FIG. 1B, a single-phase output voltage Va generated by the inverter leg 10a is applied to an output load, which is shown as an LC network (L and $C_{out}$). This output voltage Va is generated at a node that is common to a current carrying terminal (e.g., emitter terminal) of the second silicon IGBT Q2 and a current carrying terminal (e.g., collector terminal) of the third silicon IGBT Q3, as illustrated. Switching states of the four IGBTs Q1-Q4 are illustrated by TABLE 1. As shown by this table, for one phase of operation, when IGBTs Q1 and Q2 are "on", the output Va is pulled up to voltage Vp; when IGBTs Q2 and Q3 are "on", the output Va is connected to $V_0$; and when IGBTs Q3 and Q4 are "on", the output Va is pulled down to Vn. Moreover, from these switching states, it can be understood that IGBTs Q2 and Q3 are "on" for most of each cycle, resulting in greater conduction losses than Q1 and Q4, but with far less switching losses. In addition, the free-wheeling diodes D2 and D3 are, for most cases, soft switched as the IGBTs Q2 and Q3 are "on", thus holding the recovery voltage across the diodes D2 and D3 to that of $V_{ce}$ of the respective IGBTs Q2 and Q3.

TABLE 1

| IGBT | Va = Vp | Va = $V_0$ | Va = Vn |
|---|---|---|---|
| Q1 | On | Off | Off |
| Q2 | On | On | Off |
| Q3 | Off | On | On |
| Q4 | Off | Off | On |

Figure 1C:
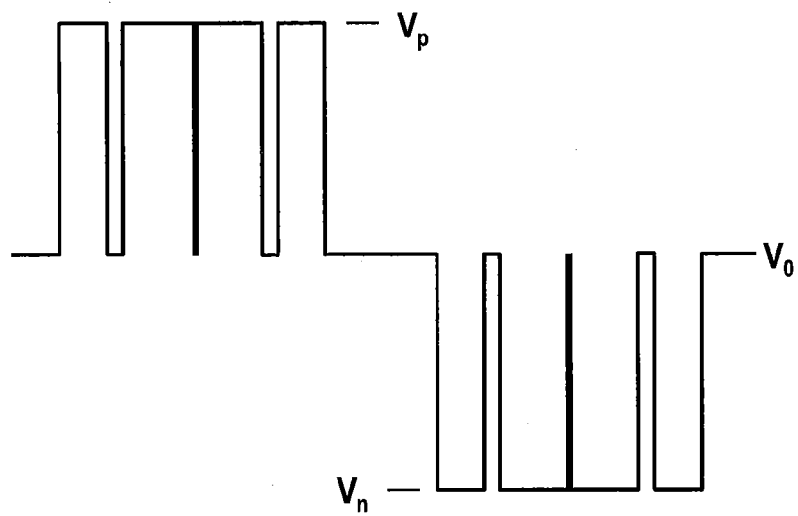
FIG. 1C is a graph of an output voltage that can be generated by the inverter leg illustrated by FIG. 1B.
Figure 1D:
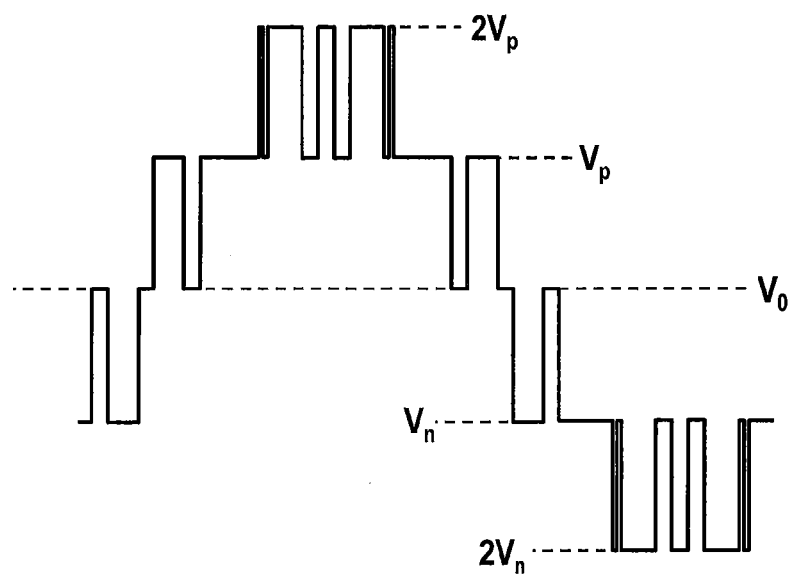
FIG. 1D is a graph of a phase-to-phase output voltage that can be generated by the NPC inverter of FIG. 1A.

FIGS. 1C-1D are graphs that illustrate the leg output voltage associated with the inverter leg of FIG. 1B and the phase-to-phase output voltage associated with the inverter of FIG. 1A, respectively. As will be understood by those skilled in the art, the effective switching frequency of the phase-to-phase voltage of FIG. 1D is twice that of the phase voltage of FIG. 1C.

Figure 2A:
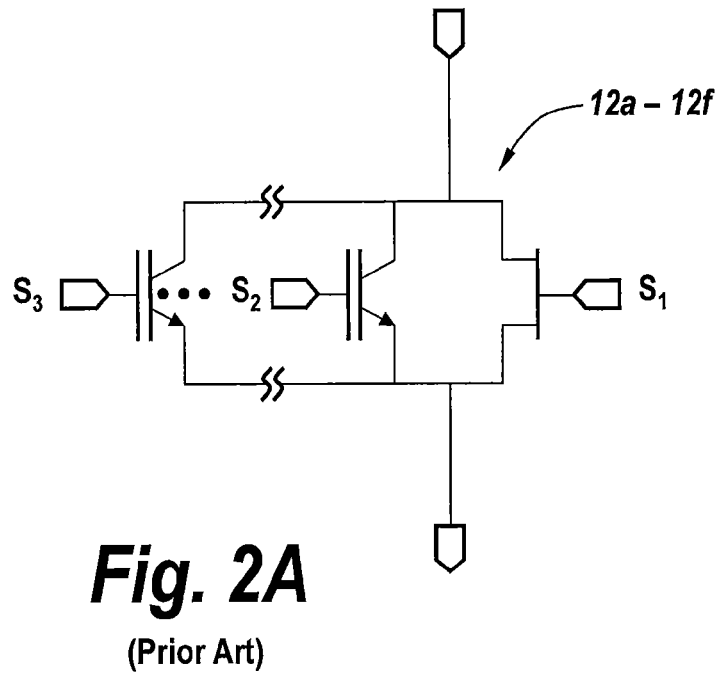
FIG. 2A is an electrical schematic of a hybrid power switch according to the prior art.

Each of the hybrid switches 12a-12f illustrated by FIGS. 1A-1B may be configured as a three-terminal wide bandgap semiconductor switching device (e.g., SiC, GaN JFETs/MOSFETs), which is responsive to a first control signal, in parallel with one or more silicon IGBTs, which are responsive to respective control signals S2, . . . , S3, as shown by FIG. 2A.

Figure 2B:
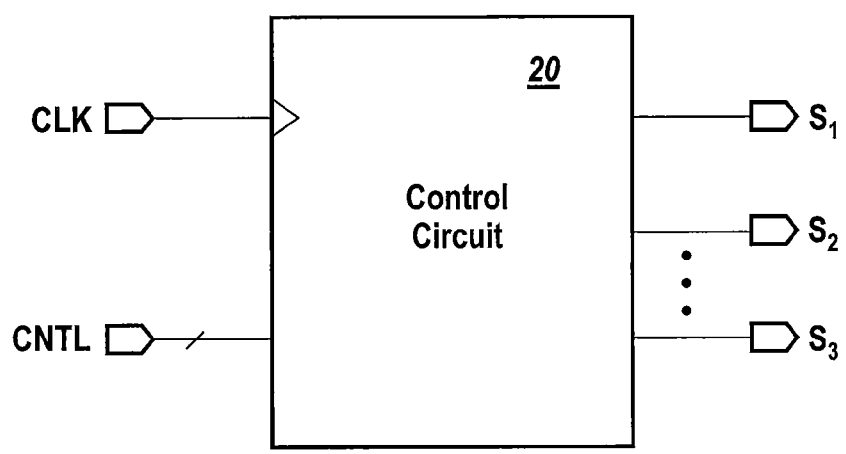
FIG. 2B is a block diagram of a conventional control circuit, which may be used to provide control signals to the hybrid power switch of FIG. 2A.
Figure 3A:
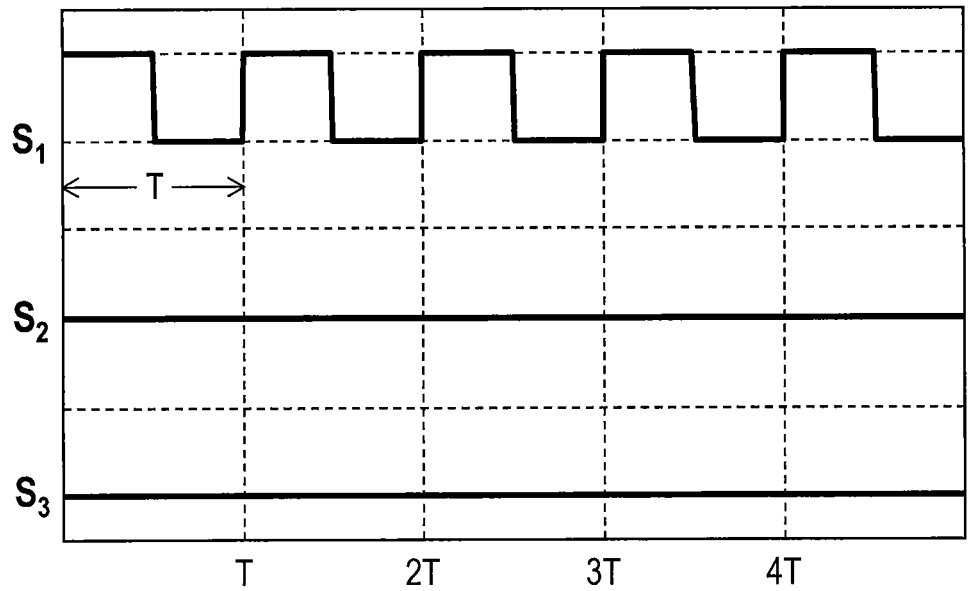
FIG. 3A is a timing diagram that illustrates timing of signals generated by the control circuit of FIG. 2B during light/partial load conditions.
Figure 3B:
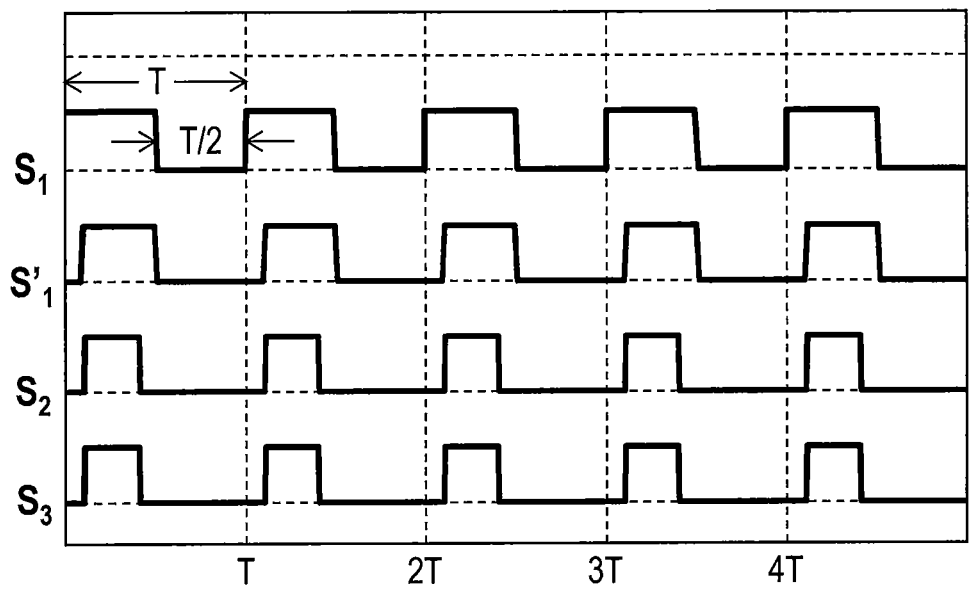
FIG. 3B is a timing diagram that illustrates timing of signals generated by the control circuit of FIG. 2B during heavy load conditions.
Figure 4:
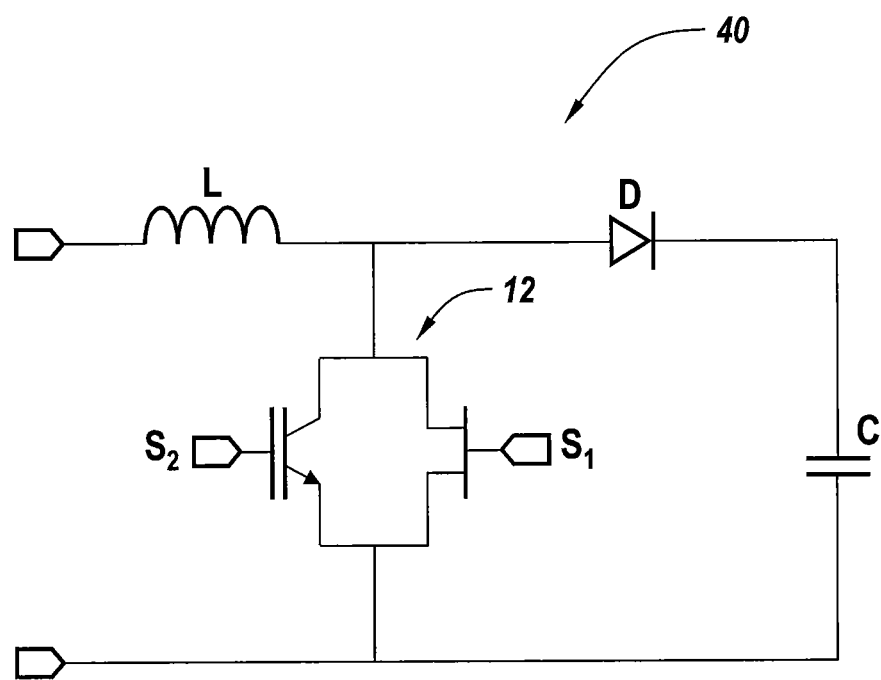
FIG. 4 is an electrical schematic of a boost converter according to the prior art.

Referring now to FIG. 2B and FIGS. 3A-3B, the control signals S1-S3 may be generated as periodic signals by a control circuit 20, which is responsive to a clock signal CLK and one or more control signals CNTL. In particular, FIG. 3A is a timing diagram that illustrates the generation of a first control signal S1 having a 50% duty cycle during light or partial load conditions when the wide bandgap switching device (e.g., JFET/MOSFET) is active and determines the overall conducting and switching losses, but the parallel IGBTs remain inactive in response to inactive control signals S2, . . . , S3. In contrast, as illustrated by FIG. 3B, during heavy load conditions, the parallel IGBTs are driven by periodic control signals having <50% duty cycles. In particular, to reduce switching losses within the hybrid switches 12a-12f, the inactive-to-active (e.g., low-to-high) transitions and active-to-inactive (e.g., high-to-low) transitions of control signals S2 and S3 occur exclusively within the active phases of the first periodic control signal S1, which means that during each active cycle, the wide bandgap switching device turns on before the IGBTs and turns off after the IGBTs. Accordingly, during heavy load conditions, conduction losses are determined by both the wide bandgap switches and IGBTs, but switching losses are determined mostly by the wide bandgap switches, which typically provide superior performance compared to Si-IGBTs in terms of on-state resistance and turn on/off losses. Alternatively, because of the typically slower turn-on characteristics of silicon IGBTs relative to GaN JFETs, the leading inactive-to-active edge of the control signal S1' that drives the wide bandgap switching device may be aligned with the leading inactive-to-active edges of the control signals S2 and S3, in order to simplify the logic within the control circuit 20. As described hereinabove, hybrid switches may be utilized in all IGBT-based topologies where switching losses are significant. Thus, as illustrated by FIG. 4, an otherwise conventional boost converter 40 containing an inductor (L), diode (D) and capacitor (C) network may utilize a hybrid switch 12, which is responsive to a pair of control signals S1, S2.

Furthermore, because the conduction losses of SiC power devices are not consistently lower than those in the same rated Si devices at high current levels, the commutation of Si and SiC devices in a hybrid package should be treated differently as a function of load current in order to minimize conduction losses in hybrid devices. In addition, because SiC devices typically have faster switching speeds relative to Si devices, a unified switching pattern for both SiC and Si devices in a module containing a hybrid device (a/k/a "hybrid module") typically cannot avoid significant switch-off losses associated with the Si devices, which often have significantly slower switch-off speeds. To address these dissimilar characteristics of SiC and Si devices within a hybrid device, a plurality of different switching patterns can be used to minimize hybrid device losses, improve overcurrent capability and guarantee safe operation. In particular, as described more fully hereinbelow, switching patterns according to embodiments of the invention can enable zero-voltage switching (ZVS) of Si IGBTs in a hybrid module and minimize conduction and switching losses based on a wide range of instantaneous load current values.

Figure 5:
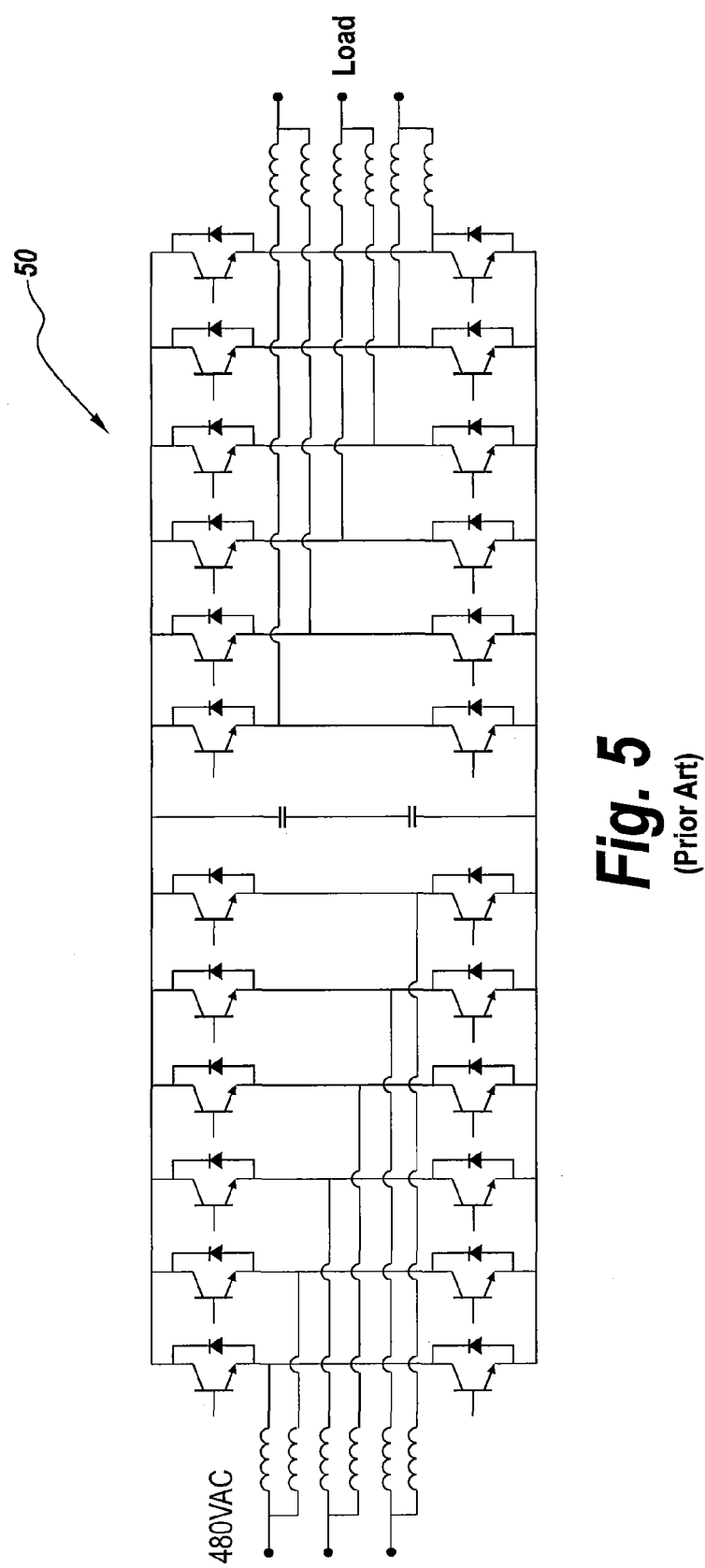
FIG. 5 is an electrical schematic of a two-level back-to-back Voltage Source Converter (VSC) according to the prior art.
Figure 6A:
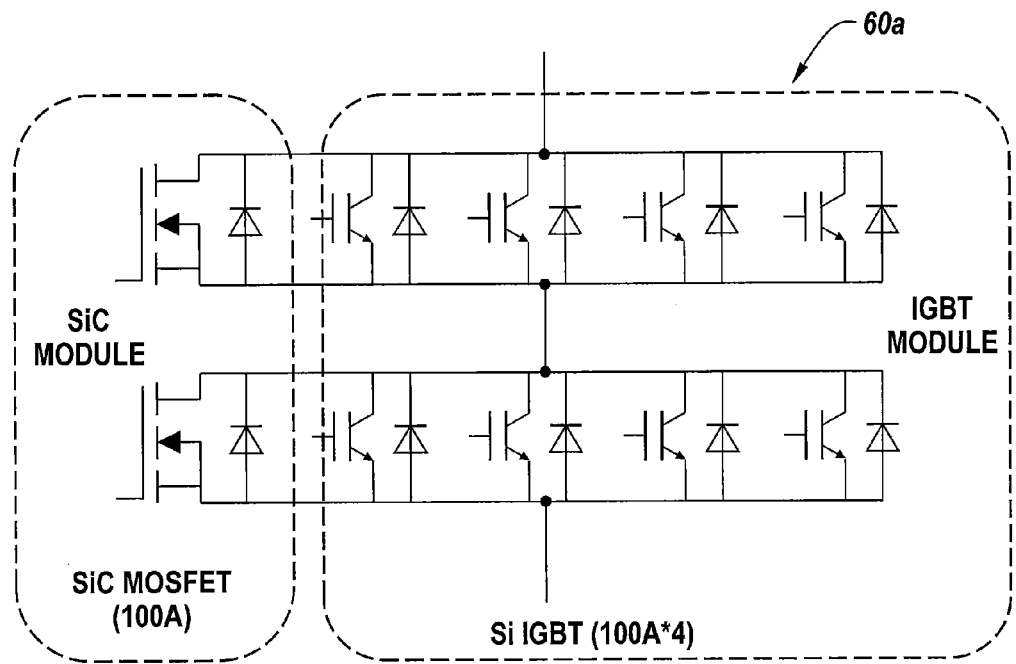
FIG. 6A is an electrical schematic of an integrated circuit containing a plurality of hybrid devices (SiC MOSFET+Si IGBTs) connected in a half-bridge configuration.
Figure 6B:
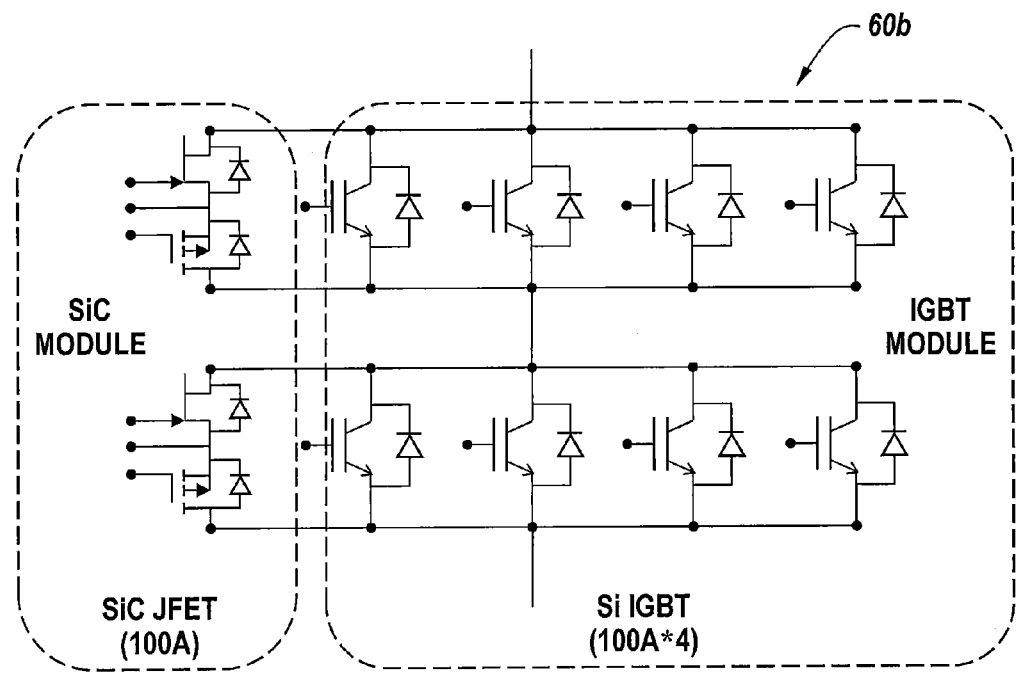
FIG. 6B is an electrical schematic of an integrated circuit containing a plurality of hybrid devices (SiC JFET+Si IGBTs) connected in a half-bridge configuration.

Referring now to FIG. 5, a conventional two-level back-to-back Voltage Source Converter (VSC) 50 is shown as having dual legs in each phase, with each leg containing exclusively Si IGBTs. If the Si IGBTs are rated at 500 A/1200V, for example, then to configure a corresponding hybrid device with the same ratings as the IGBTs, one SiC device (100 A) and four Si IGBTs (4×100 A) can be parallel-connected to replace each 5×100 A IGBT. As illustrated by the half-bridge configurations 60a, 60b of FIGS. 6A-6B, both SiC MOSFETs and SiC JFETs can be utilized as an embodiment of the SiC device. Such devices are publicly available from power device manufacturers, such as Infineon™ (e.g., Si IGBT FF100R12YT3, SiC JFET FF45R12W1J1) and CREE™ (e.g., SiC MOSFET CAS100H12AM1).

Figure 7A:
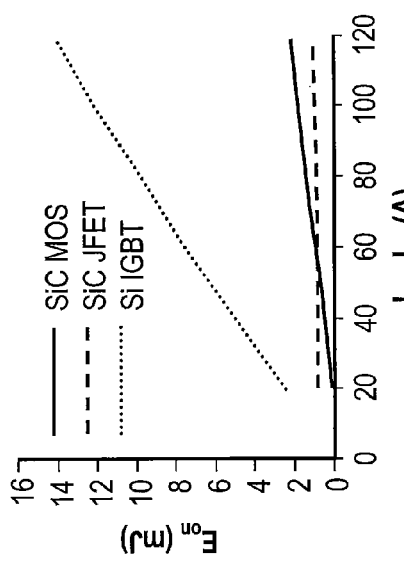
FIG. 7A is a graph of I-V curves for a SiC MOSFET, SiC JFET and Si IGBT at a junction temperature of 25° C.
Figure 7B:
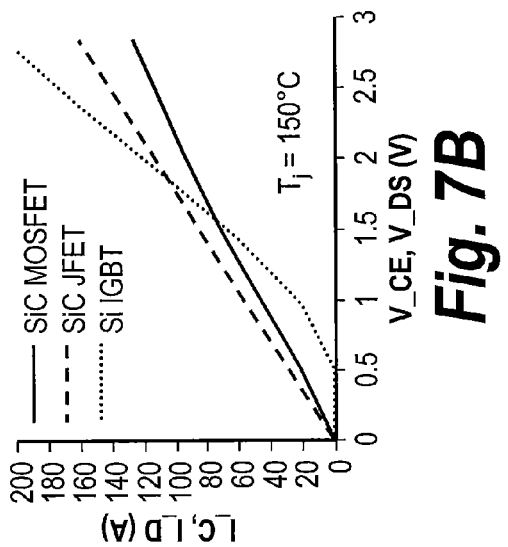
FIG. 7B is a graph of I-V curves for a SiC MOSFET, SiC JFET and Si IGBT at a junction temperature of 150° C.
Figure 7C:
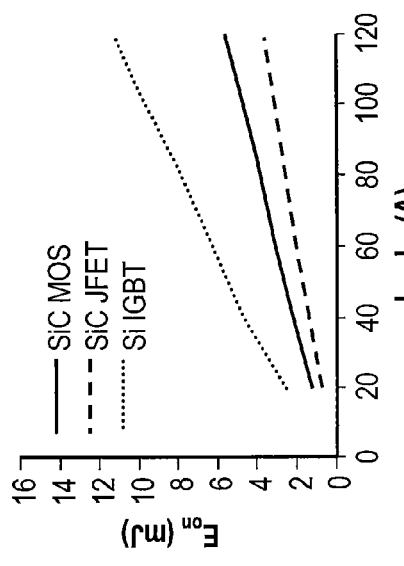
FIG. 7C is an illustration of graphs of turn-on energy (Eon) versus current for an SiC MOSFET, SiC JFET and Si IGBT.
Figure 7D:
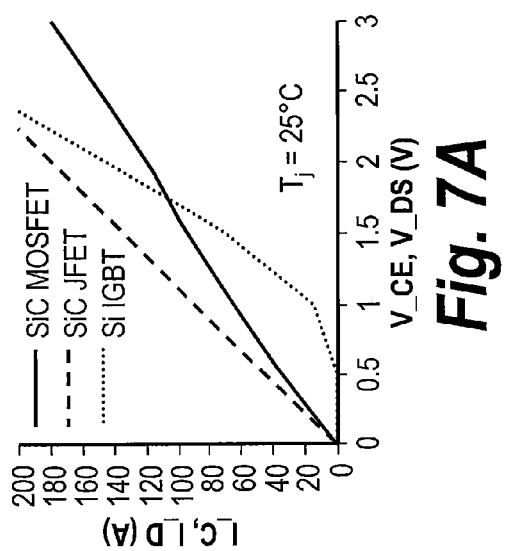
FIG. 7D is an illustration of graphs of turn-off energy (Eoff) versus current for an SiC MOSFET, SiC JFET and Si IGBT.

A comparison of the output characteristics between exemplary 100 A SiC devices (SiC MOSFET, JFET) and an exemplary 100 A Si IGBT is shown for junction temperatures of $T_j=25°$ C. and 150° C. in FIGS. 7A and 7B, respectively, where I_C, I_D designate collector (C) current and drain (D) current, respectively, and V_CE, V_DS designate collector-emitter voltage and drain-source voltage, respectively. In addition, a comparison of turn-on and turn-off switching energies ($E_{on}$ and $E_{off}$) between SiC devices and Si IGBTs are shown by FIGS. 7C-7D, where $I_{DS}$, $I_{CE}$ designate drain-to-source current and collector-to-emitter current. As illustrated by FIGS. 7A-7B, the SiC device conduction voltage drop is lower than the corresponding conduction voltage drop of the Si IGBT in the low current range but higher in the high current range. Moreover, as illustrated by FIGS. 7C-7D, the switching on/off energy of each SiC device is significantly lower than the switching on/off energy for the Si IGBTs as a result of differences between Si and SiC material properties (e.g., the wider bandgap of SiC).

As will now be described with respect to FIGS. 8-10, a plurality of different switching patterns can be utilized for the Si and SiC devices as a function of a time-varying load current within a sinusoidal fundamental cycle, for example, or another time-varying load current waveform according to other embodiments of the invention. These switching patterns preferentially utilize attractive characteristics of each type of device in a hybrid module 60c so that overall turn-on/off energy losses may be reduced concurrently with improved overcurrent capability, while still maintaining safe operating area (SOA) operation within each of the parallel devices. According to some embodiments of the invention, a preferred switching pattern may consist of at least three (3) sub-patterns I, II and III associated with respective I, II and III non-overlapping ranges of load current.

In Sub-Pattern I, only the SiC device is switched on/off while the Si devices remain inactive and do not contribute to forward on-state conduction within the hybrid module 60c. The first switching pattern is utilized when the load current is below the boundary load current value $I_1$, which is determined by the corresponding SiC device current at the Si IGBT threshold voltage of its I-V curve. When the hybrid device current is below this boundary current, the voltage drop across the SiC device is not high enough to enable conduction in the IGBTs. This first pattern ensures safe operation of a hybrid module 60c and minimizes turn-on/off energy losses under relatively light load conditions. As will be understood by those skilled in the art, this sub-pattern may be used frequently in UPS applications because most 3-phase UPS devices typically operate in the range of 20-40 percent of maximum load.

In Sub-Pattern II, the SiC device (e.g., MOSFET, JFET) is turned on first and turned off last relative to the Si IGBTs, which means the duty cycle of the periodic control signal (e.g., gate signal) applied to the SiC device is greater than the duty cycle of the periodic control signal (e.g., gate signal) applied to the Si IGBTs. This switching pattern is applied when the load current is above $I_1$, but below the maximum SOA current $I_2$ of the SiC device. Because the on and off switching is performed first and last, respectively, by the SiC device, a very low on-state voltage (e.g., $V_{CE}$) is present when turning on/off the IGBTs. This method of on/off switching for the IGBTs is typically referred to as zero voltage switching (ZVS).

Figure 8:
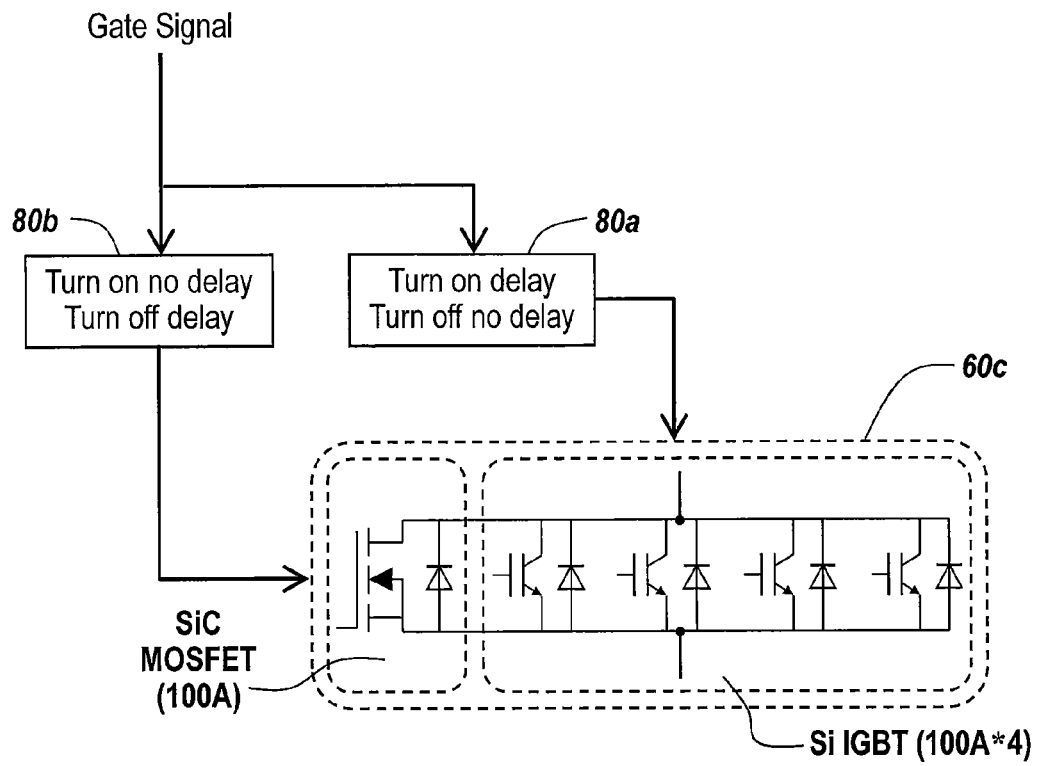
FIG. 8 is a block diagram illustrating the timing of gate signals to a hybrid device using a plurality of delay devices.
Figure 9:
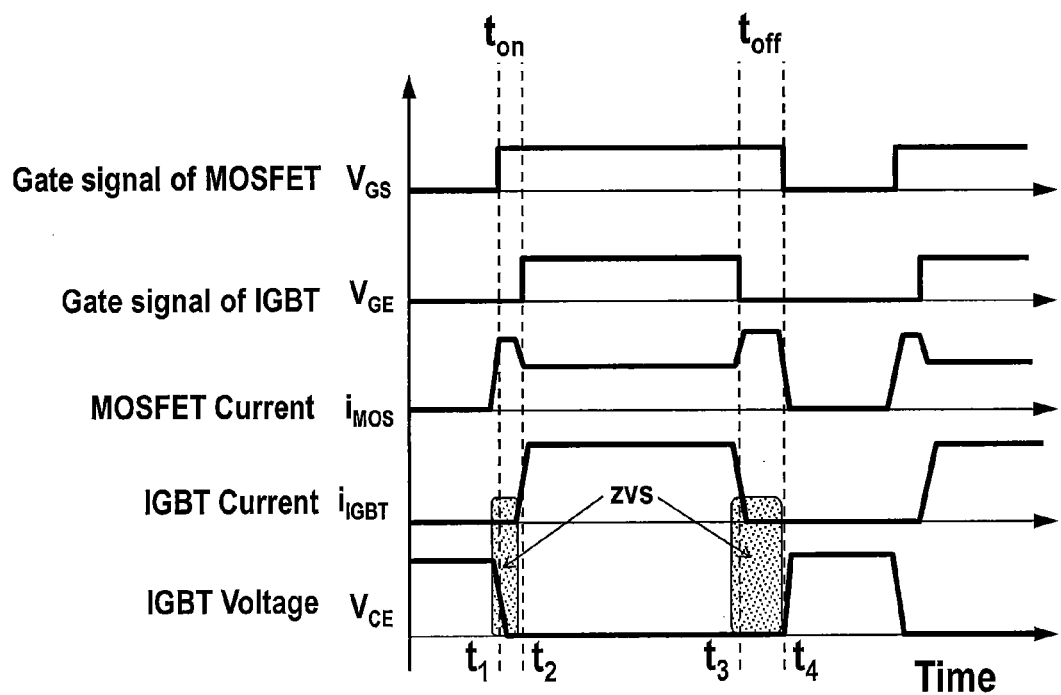
FIG. 9 is a timing diagram illustrating the operation of the hybrid device of FIG. 8.

Thus, to provide ZVS for the IGBTs and because of the typically much faster switching speed and lower switching losses of SiC devices in hybrid modules, a first time delay is imposed on the turn-on of the Si-IGBTs relative to the SiC MOSFET/JFET and a second time delay is imposed on the turn-off of the SiC MOSFET/JFET relative to the Si-IGBTs, as shown by the delay control devices 80a and 80b of FIG. 8 and the timing diagram of FIG. 9. The specific values of time delay $t_{on}$ and $t_{off}$ in the timing diagram of FIG. 9 can be determined by the relative switching speeds of the SiC and Si devices and, in some embodiments of the invention, the length of dead time between two complementary hybrid modules in the VSCs. For example, the turn-on and turn-off delays between the SiC MOSFET/JFET and the Si IGBTs can be sufficient to guarantee that during the turn-on process, the SiC device is fully turned on before the Si IGBTs turn on (e.g., the SiC device current reaches above about 90% of the steady state SiC device current), but during the turn-off process, the Si IGBTs are fully turned off before the SiC device turns off (e.g., the Si IGBT current reaches below about 10% of the IGBT steady state current). As will be understood by those skilled in the art, "current spikes" typically occur in the SiC during turn-on and turn-off because all the load current must flow through the SiC MOSFET/JFET during the turn-on and turn-off delay time intervals. To account for these "current spikes", transient thermal analysis may be used to determine the boundary load current value $I_2$ so that the SiC device is capable of conducting the spiked peak current for a short duration (e.g., a few microseconds).

In Sub-Pattern III, the Si IGBTs are turned on first and turned off last relative to the SiC device(s), which means the duty cycle of the periodic control signal applied to the Si IGBTs is greater than the duty cycle of the periodic control signal applied to the SiC device. One goal of using this switching pattern is to ensure that the load current can be interrupted safely by the IGBTs whenever the load current exceeds the SOA of the lower current rating of the SiC device. To achieve this goal of safe current interruption, the Si IGBTs are turned on first and turned off last preferably whenever the load current is outside the SOA of the SiC device(s).

Figure 10A:
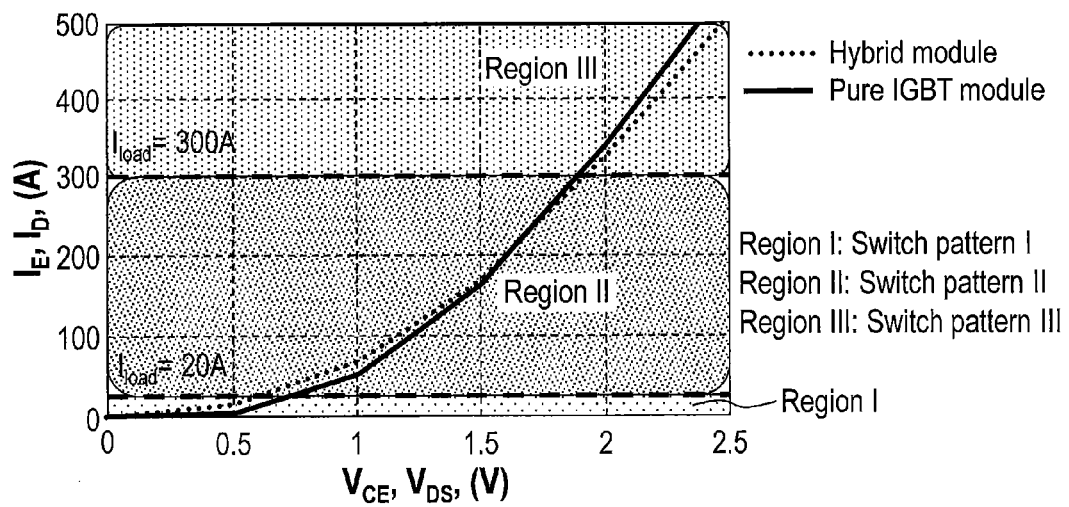
FIG. 10A illustrates a plurality of current ranges associated with respective switching patterns, according to embodiments of the invention.
Figure 10B:
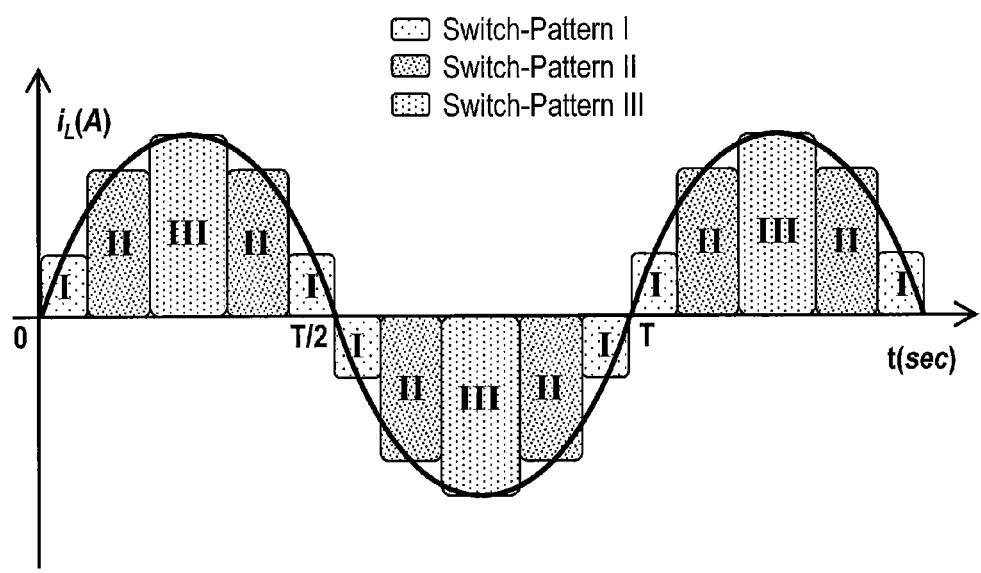
FIG. 10B is a diagram illustrating the use of the switching patterns of FIG. 10A during the generation of a sinusoidal load current.

As illustrated by FIGS. 10A-10B, an embodiment of an optimal current-dependent switching pattern for the 500 A hybrid device 60c described herein includes using different sub-patterns for different regions in the SiC and Si device I-V curves, as shown by FIG. 7, for example. In addition, an implementation of the proposed optimal current-dependent switching pattern in a sinusoidal load current application is illustrated by FIG. 10B, where $i_L(A)$ is the sinusoidal load current, $I_E$ and $I_D$ designate emitter and drain currents, respectively, and $V_{CE}$, $V_{DS}$ designates collector-to-emitter voltage and drain-to-source voltage, respectively.

According to some embodiments of the invention, an optimal current-dependent switching pattern with specific current levels determined based on device ratings and thermal analysis of typical SiC and Si power devices can be described as follows:

1) For light load currents, $i_L \leq 20$ A, Sub-Pattern I can be used, which means that only the SiC MOSFET is switched on/off. The current level of 20 A is the SiC MOSFET current at the IGBT threshold voltage (according to its I-V curve at junction temperatures of $T_j=150°$ C.). As illustrated by the graphs of FIG. 7, because the SiC device has lower conduction and switching losses than the Si IGBTs in the low load current region, only the SiC device is switched on/off to support the desired load current waveform shown by FIG. 10B;

2) For load currents in the range of 20 A<$i_L \leq 300$ A, Sub-Pattern II can be used, in which the SiC device is turned on first and turned off last, as illustrated by the timing diagram of FIG. 9. In this sub-pattern, the SiC device is turned on first and turned off last as illustrated in FIG. 8. Because the load current is above the boundary load value $I_1$ (20 A), the IGBTs can be turned on to share the current with the SiC device and reduce the total conduction losses. Furthermore, this sub-pattern enables the ZVS operation of the IGBT devices, so essentially all the switching losses occur at the SiC device, which has a significantly smaller switching loss than an IGBT at the same current level. The upper limit of this current region ($I_2$=300 A) is based on both transient thermal analysis and SOA characteristics from the SiC device datasheet; and 3) For load current in the uppermost range of 300 A<$i_L \leq 500$ A, Sub-Pattern III can be applied, in which the Si IGBTs are switched on first and switched off last to thereby guarantee the safe operation of the SiC device. The timing of this Sub-Pattern III is essentially the inverse of the timing shown in FIG. 9. According to alternative embodiments of the invention, this uppermost "Pattern III" current range may be modified to include a relatively lower range (e.g., 300 A<$i_L \leq 400$ A) when only the Si IGBTs are active and the SiC device is inactive and a relatively higher range (e.g., 400 A<$i_L \leq 500$ A) when the Si IGBTs are switched on first and switched off last relative to the SiC device.

Figure 11:
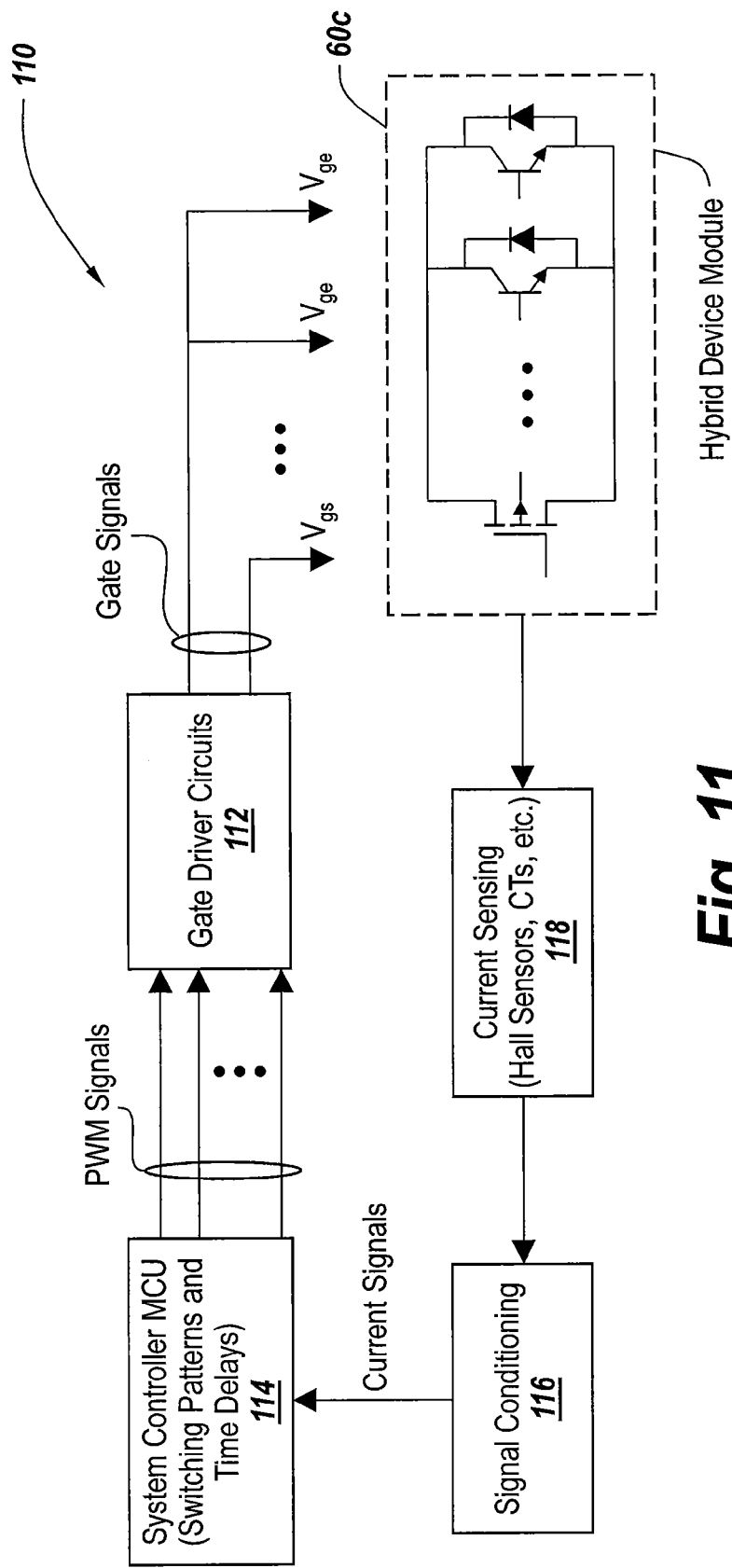
FIG. 11 is a block diagram a control circuit utilized to drive hybrid devices according to an embodiment of the invention.

Operations to drive the control terminals (e.g., gate terminals) of the SiC and Si devices within the hybrid module with signals that support the aforementioned current-dependent switching patterns I-III require frequent detection of an instantaneous time-dependent load current $i_L$ for each hybrid device (e.g., sinusoidal load current of FIG. 10B). Conventional current sensing techniques typically require use of Hall-effect current sensors, current transformers (CT) or Rogowski coils, but when each hybrid device requires current measurements, it becomes expensive, physically bulky and typically sensitive to environmental variations. A block diagram of a control circuit 110 for a hybrid power device 60c is illustrated by FIG. 11. This control circuit 110 includes a closed feedback loop, which is shown as including a current sensing device 118, a signal conditioning circuit 116, a digital signal processor (DSP)/microcontroller (μC) 114, which generates pulse-width modulated (PWM) signals, and gate driver 112, connected as illustrated.

As will be understood by those skilled in the art, the control circuit 110 of FIG. 11 may possess one or more drawbacks, including: (i) the likelihood of increased system costs and physical size due to the inclusion of relatively expensive and bulky Hall sensors/CTs; (ii) the relatively limited bandwidth and temperature sensitivity of the current sensing method; and (iii) an increased computational burden on the system microcontroller (DSP/μC), which would be required to make calculations associated with the switching patterns for the hybrid device in each current cycle if the methods described herein were performed.

Figure 12A:
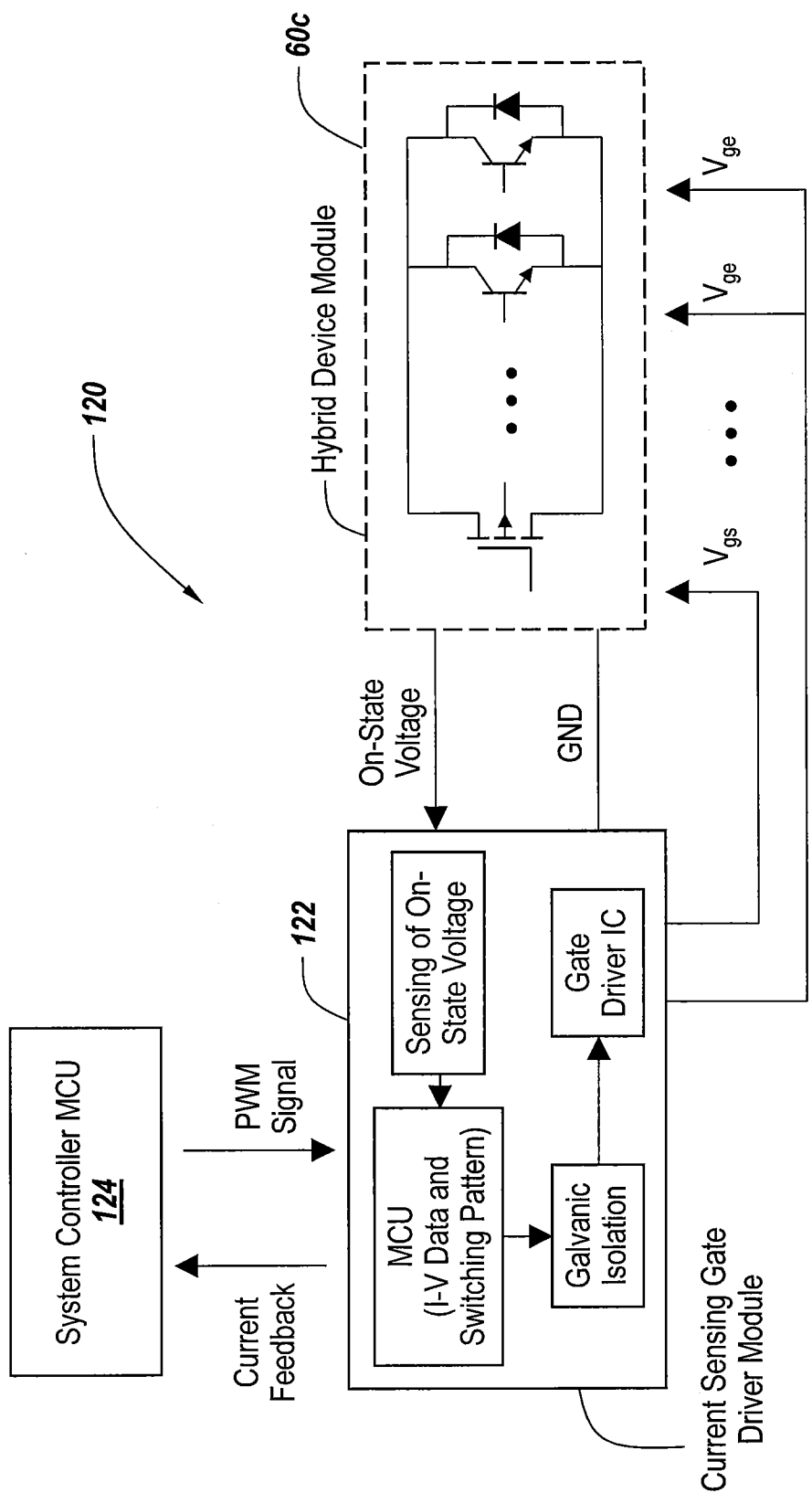
FIG. 12A is a block diagram of a control circuit containing an intelligent gate driver module, which is utilized to drive hybrid devices according to an embodiment of the present invention.
Figure 12B:
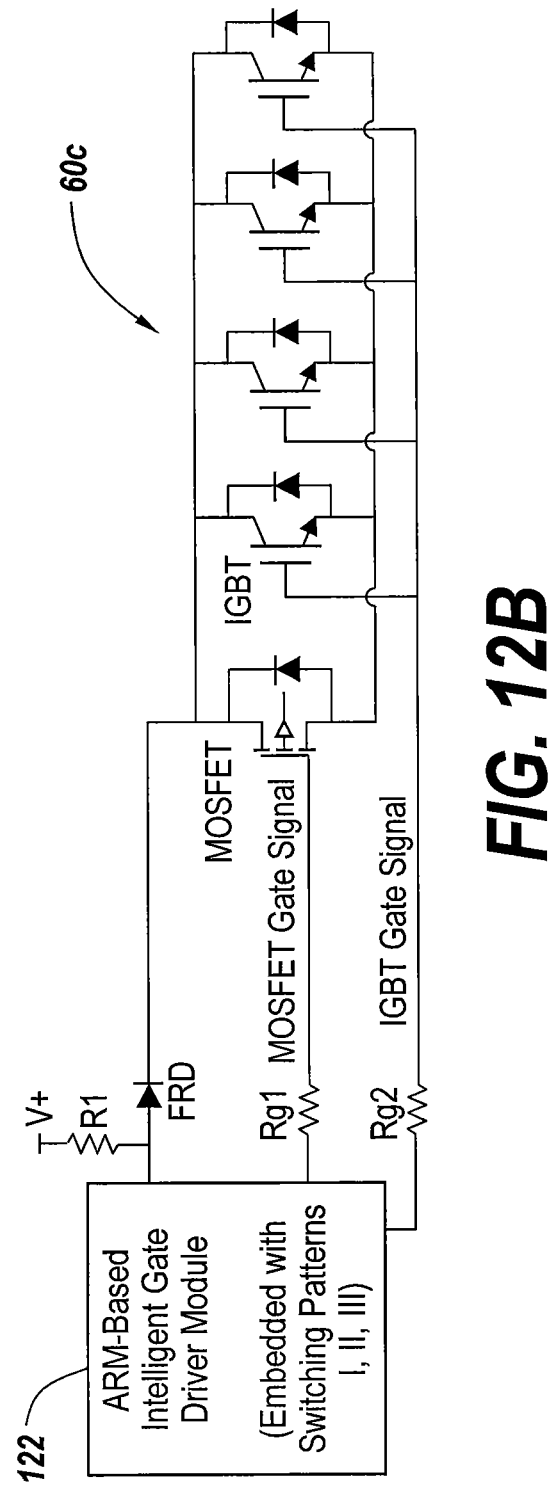
FIG. 12B is an electrical schematic of an embodiment of the control circuit and hybrid device of FIG. 12A, according to the invention.

To address these limitations, embodiments of the invention utilize an intelligent current sensing method within "local" a control circuit 120 containing a gate driver module 122, as illustrated by FIGS. 12A-12B. This control circuit 120 utilizes a closed-loop feedback path to provide control signals (e.g., gate signals $V_{GS}$, $V_{GE}$) to the hybrid device 60c, in response to PWM signals generated by a system controller 124 (DSP/(μC). This gate driver module 122 takes advantage of the output characteristics of each of the parallel power devices (IGBT, MOSFET, JFET, etc), by continuously measuring the on-state voltages of these devices in real time. As will be explained more fully hereinbelow, the continuous measurements of the on-state voltages support a determination of the instantaneous device current for the hybrid device 60c. In response to this determination of instantaneous current, a relatively low-cost high-speed ARM microcontroller (or any other high-speed controller/ASIC chip), which is preferably integrated locally within the gate driver module, is utilized to support generation of the desired gate driving signals to the plurality of parallel devices within the hybrid device 60c, in accordance with the switching patterns I-III of FIGS. 10A-10B.

As illustrated by FIG. 12B, an indirect measurement of device on-state voltage ($V_{Ds}$ or $V_{CE}$) can be made by connecting a cathode of a high-voltage fast recovery diode (FRD) to the IGBT collector terminals and MOSFET drain terminal. Based on this configuration, any on-state conduction in one or more of the parallel MOSFET and IGBT devices will cause the FRD to become forward biased to thereby enable capture of the on-state voltage of the hybrid device 60c by the ARM-based intelligent gate driver module 122. This on-state voltage of the hybrid device 60c is equivalent to the voltage at the anode of the FRD minus its built-in forward voltage drop. The relatively negligible forward on-state current in the FRD is supported by the pull-up resistor R1, which in combination with the FRD operates as a voltage divider of a pull-up voltage V+.

The "local" intelligent gate driver module 122 controls the time-dependent switching operations to be undertaken by the hybrid device 60c, by driving the gate terminals of the MOSFET and IGBT devices with respective gate signals ($V_{GS}$, $V_{GE}$) that support a desired switching pattern I-III and achieves a desired forward on-state current for a particular application. As shown, these gate signals may be provided through resistors Rg1 and Rg2, which may be utilized to adjust switch-on timing and are typically specified in a datasheet provided by the manufacturer.

A highly accurate "measurement" of instantaneous load current can be computed as an estimate from: (i) the measured instantaneous on-state voltage ($V_{CE}(t)$, $V_{DS}(t)$) and measured junction temperature ($T_j$) of the hybrid device, (ii) the current switching pattern associated with the measured instantaneous on-state voltage, and (iii) the curves associated with the hybrid device at the measured $T_j$ and the gate voltages $V_{GS}$, $V_{GE}$ of the MOSFET and IGBT devices, respectively. In some cases, NTC thermistors may be used to estimate an average value of $T_j$. But, because NTC thermistors typically measure $T_{CASE}$, the temperature of the hybrid device package, $T_j$ may need to be estimated based on $T_{CASE}$ and other thermal parameters of the hybrid device. If the actual or computed value of $T_j$ is unavailable, then stored curve data associated with the highest $T_j$ may be used to guarantee that all selected switching patterns work within a safe operating area (SOA) of the hybrid device 60c. This alternative handling of temperature measurement may come at some loss in performance/efficiency.

Figure 13:
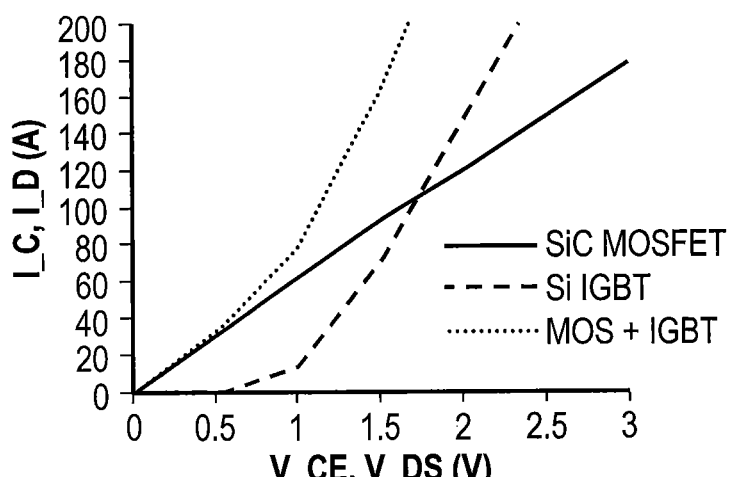
FIG. 13 is a graph of I-V curves for a SiC MOSFET, Si IGBT and SiC MOSFET+Si IGBT.

Thus, as shown by FIG. 13, the characteristics of the hybrid device 60c are a function of the specific switching pattern being applied to the parallel devices therein. Thus, at light load conditions when only the SiC MOSFET is being switched on/off, only the curve associated with the SiC MOSFET at a respective gate voltage and temperature is relevant. But, at relatively heavy load conditions, both the SiC MOSFET and Si IGBTs are turned on. This means the curves for the Si MOSFET and Si IGBTs at their respective gate voltages $V_{GS}$, $V_{GE}$, (which can be preset in the integrated AMR-based intelligent gate driver module) and junction temperatures $T_j$ need to be considered together to determine a combined I-V curve, which is identified in FIG. 13 as the "MOS+IGBT" I-V curve.

Once the instantaneous on-state voltage $V_{CE}$, $V_{DS}$ has been measured and an internally stored curve has been selected based on the aforementioned criteria, the instantaneous forward on-state current in each active parallel device can be estimated and summed together to yield an estimate of total instantaneous load current. According to some embodiments of the invention, the AMR-based intelligent gate driver module may include a storage device, such as a non-volatile look-up table, which contains I-V data associated with the preset I-V curves therein. To support high accuracy estimates, turn-on delay values should be preset in the ARM-based driver module to make sure that device currents are estimated during steady on-state conditions, rather than during transition states. Moreover, any reverse currents in any of the freewheeling diodes during reverse recovery (or during any forward on-state conduction) can generally be ignored. Of course, once an estimated current value exceeds a maximum threshold value for safe operation, the ARM-based driver module should turn off all devices within the hybrid device immediately. Finally, the value of any turn-on and turn-off delays in the optimal switching patterns II and III, as highlighted above with respect to FIGS. 8-9, can be dynamically adjusted in ARM-based driver module in response to changes in the junction temperatures $T_j$.

As will be understood by those skilled in the art, the aforementioned current-sensing operations in the ARM-based gate driver module possess a number of advantages compared to conventional gate drivers. First, lower cost and more compact operation can be achieved because no bulky Hall sensors or CTs are required. Second, conventional short-circuit desaturation detection circuits based on analog comparators and logic ICs can be eliminated. The ARM-based operations as described herein are also noninvasive to the overall system control operations and alleviate excessive computational effort performed by the system controller (DSP/MCU). Short-circuit protection is also much faster and more reliable.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit, comprising:
a hybrid switch comprising first and second switching devices of different type, which are electrically coupled together to support parallel currents therein in response to respective control signals received at respective first and second control terminals of the first and second switching devices, said first switching device comprising a three or more terminal switching device selected from a group consisting of junction field effect transistors (JFETs), insulated-gate field effect transistors (IGFETs), integrated gate-commutated thyristors (IGCT) and high electron mobility transistors (HEMTs) and said second switching device comprising at least one insulated-gate bipolar transistor (IGBT); and
a control circuit configured to drive the first and second control terminals with respective first and second periodic control signals having first and second unequal duty cycles, respectively, when the first and second switching devices are disposed to collectively support a forward current in a first current range, and further configured to drive the first and second control terminals with respective third and fourth periodic control signals having third and fourth unequal duty cycles, respectively, when the first and second switching devices are disposed to collectively support a forward current in a second current range outside the first current range, said first duty cycle greater than said second duty cycle and said third duty cycle less than said fourth duty cycle;
wherein active phases of the second periodic control signal occur exclusively within active phases of the first periodic control signal and active phases of the third periodic control signal occur exclusively within active phases of the fourth periodic control signal.

2. The integrated circuit of claim 1, wherein active-to-inactive transitions of the second periodic control signal precede corresponding active-to-inactive transitions of the first periodic control signal.

3. The integrated circuit of claim 2, wherein inactive-to-active transitions of the first periodic control signal precede corresponding inactive-to-active transitions of the second periodic control signal.

4. The integrated circuit of claim 3, wherein inactive-to-active transitions of the fourth periodic control signal precede corresponding inactive-to-active transitions of the third periodic control signal.

5. The integrated circuit of claim 4, wherein active-to-inactive transitions of the third periodic control signal precede corresponding active-to-inactive transitions of the fourth periodic control signal.

6. The integrated circuit of claim 1, wherein the first switching device comprises a wide bandgap semiconductor material and the second switching device is a silicon IGBT; and wherein the wide bandgap semiconductor material is selected from a group consisting of silicon carbide (SiC), gallium nitride (GaN) and diamond.

7. The integrated circuit of claim 1, wherein said control circuit is further configured to hold the first control terminal at an inactive voltage level when the second switching device is disposed to support a forward current in a third current range intermediate the first and second current ranges, in response to a fifth periodic control signal generated by said control circuit.

8. The integrated circuit of claim 7, wherein said control circuit is further configured to hold the second control terminal at an inactive voltage level when the first switching device is disposed to support a forward current in a current range below the first current range, in response to a sixth periodic control signal generated by said control circuit.

9. The integrated circuit of claim 1, wherein said control circuit is further configured to hold the second control terminal at an inactive voltage level when the first switching device is disposed to support a forward current in a current range below the first current range, in response to a sixth periodic control signal generated by said control circuit.

10. An integrated circuit, comprising:
a hybrid switch comprising first and second switching devices of different type, which are electrically coupled together to support parallel currents therein in response to respective control signals received at respective first and second control terminals of the first and second switching devices, said first switching device comprising a three or more terminal switching device selected from a group consisting of junction field effect transistors (JFETs), insulated-gate field effect transistors (IGFETs), integrated gate-commutated thyristors (IGCT) and high electron mobility transistors (HEMTs) and said second switching device comprising at least one insulated-gate bipolar transistor (IGBT); and
a control circuit configured to drive the first and second control terminals with respective first and second periodic control signals having first and second unequal duty cycles, respectively, when the first and second switching devices are disposed to collectively support a forward current at a first current level, and further configured to drive the first and second control terminals with respective third and fourth periodic control signals having third and fourth unequal duty cycles, respectively, when the first and second switching devices are disposed to collectively support a forward current at a second current level greater than the first current level, said first and fourth duty cycles greater than said second and third duty cycles, respectively;
wherein active phases of the second periodic control signal occur exclusively within active phases of the first periodic control signal and active phases of the third periodic control signal occur exclusively within active phases of the fourth periodic control signal.

11. The integrated circuit of claim 10, wherein said control circuit is further configured to hold the first control terminal at an inactive voltage level when the second switching device is disposed to support a forward current at a third current level intermediate the first and second current levels, in response to a fifth periodic control signal generated by said control circuit.

12. The integrated circuit of claim 10, wherein the first switching device comprises a first semiconductor material having a first bandgap and the second switching device comprises a second semiconductor material having a second bandgap less than the first bandgap.

13. The integrated circuit of claim 10, wherein said control circuit comprises a reduced instruction set computing (RISC) controller and a look-up table therein.

14. An integrated circuit, comprising:
a hybrid switch comprising at least one SiC-FET and a plurality of Si-IGBTs electrically coupled together to support at least first and second parallel currents in the hybrid switch that are provided to a load, which is electrically coupled to said hybrid switch; and
a control circuit configured to repeatedly switch the at least one SiC-FET and plurality of Si-IGBTs in said hybrid switch on-and-off to thereby support an increasing current in the load using the following switching patterns, in sequence: (i) SiC-FET only; (ii) SiC-FET first turn-on, SiC-FET last turn-off, with Si-IGBT conduction support; (iii) Si-IGBT only (optional); and (iv) Si-IGBT first turn-on, Si-IGBT last turn-off, with SiC-FET conduction support.

15. The integrated circuit of claim 14, wherein the switching patterns applied to said hybrid switch in sequence for an increasing load current are: (i) SiC-FET only at a first current level; (ii) SiC-FET first turn-on, SiC-FET last turn-off, with Si-IGBT conduction support, at a second current level greater than the first current level; (iii) Si-IGBT only (optional) at a third current level greater than the second current level; and (iv) Si-IGBT first turn-on, Si-IGBT last turn-off, with SiC-FET conduction support at a fourth current level greater than the second current level.

16. The integrated circuit of claim 14, wherein the switching patterns applied to said hybrid switch in sequence for an increasing load current are: (i) SiC-FET only at a first current level; (ii) SiC-FET first turn-on, SiC-FET last turn-off, with Si-IGBT conduction support, at a second current level greater than the first current level; (iii) Si-IGBT only at a third current level greater than the second current level; and (iv) Si-IGBT first turn-on, Si-IGBT last turn-off, with SiC-FET conduction support at a fourth current level greater than the third current level.

* * * * *